United States Patent
Muramatsu et al.

(10) Patent No.: US 6,420,664 B1
(45) Date of Patent: Jul. 16, 2002

(54) METAL FOIL HAVING BUMPS, CIRCUIT SUBSTRATE HAVING THE METAL FOIL, AND SEMICONDUCTOR DEVICE HAVING THE CIRCUIT SUBSTRATE

(75) Inventors: Shigetsugu Muramatsu; Yoshihiko Ogawa, both of Nagano; Norio Kojima, Yokohama, all of (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 0 days.

(21) Appl. No.: 09/444,642

(22) Filed: Nov. 22, 1999

(30) Foreign Application Priority Data

Nov. 26, 1998 (JP) .............................................. 10-335098

(51) Int. Cl.⁷ ............................ H01R 12/04; H05K 1/11
(52) U.S. Cl. ........................ 174/262; 174/260; 439/65
(58) Field of Search ................................ 174/255, 261, 174/262, 260; 439/65, 66, 67, 68, 69, 70, 71, 72, 73, 74, 75; 361/772–774

(56) References Cited

U.S. PATENT DOCUMENTS

| | | | |
|---|---|---|---|
| 3,881,799 A | * 5/1975 | Elliott et al. | 339/252 R |
| 5,148,265 A | 9/1992 | Khandros et al. | 357/80 |
| 5,207,887 A | 5/1993 | Crumly et al. | 205/78 |
| 5,307,561 A | 5/1994 | Feigenbaum et al. | 29/846 |
| 5,354,205 A | 10/1994 | Feigenbaum et al. | 439/67 |
| 5,412,539 A | 5/1995 | Elwell et al. | 361/792 |
| 5,518,964 A | 5/1996 | DiStefano et al. | 437/209 |
| 5,629,837 A | * 5/1997 | Barabi et al. | 361/767 |
| 5,668,405 A | * 9/1997 | Yamashita | 257/668 |
| 5,706,174 A | 1/1998 | Distefano et al. | 361/749 |
| 5,729,051 A | * 3/1998 | Nakamura | 257/668 |
| 5,886,415 A | * 3/1999 | Akagawa | 257/789 |
| 5,896,271 A | 4/1999 | Jensen et al. | 361/719 |
| 5,925,931 A | * 7/1999 | Yamamoto | 257/737 |
| 6,121,688 A | * 9/2000 | Akagawa | 257/778 |
| 6,157,084 A | * 12/2000 | Hino et al. | 257/773 |
| 6,181,569 B1 | * 1/2001 | Chakravorty | 361/761 |

FOREIGN PATENT DOCUMENTS

| | | |
|---|---|---|
| EP | 0 529 577 A | 3/1993 |
| EP | 0 649 171 A | 4/1995 |

* cited by examiner

Primary Examiner—Kamand Cuneo
Assistant Examiner—Jeremy Norris
(74) Attorney, Agent, or Firm—Pennie & Edmonds LLP

(57) ABSTRACT

A semiconductor device characterized in that: a circuit substrate of a single or multiple layer which is composed in such a manner that, bumps, which are electrically connected to connection electrodes provided on one face of a surface mount device, are arranged in the same plane arrangement as that of said connection electrodes and protruded onto one side of a sheet of metal foil, on which wiring patterns electrically connected to said bumps with each other are formed, and an insulating adhesive agent layer is made to adhere onto the one side of a sheet of metal foil having bumps, is made to adhere onto one face of the surface mount device by said insulating adhesive agent layer; and tips of the bumps respectively come into contact with the connection electrodes.

21 Claims, 11 Drawing Sheets

METAL FOIL HAVING BUMPS, CIRCUIT SUBSTRATE HAVING THE METAL FOIL, AND SEMICONDUCTOR DEVICE HAVING THE CIRCUIT SUBSTRATE

BACKGROUND OF THE INVENTION

1. Field of the Invention

The present invention relates to a sheet of metal foil having bumps, a circuit substrate having the sheet of metal foil, and a semiconductor device having the circuit substrate which are used for manufacturing a semiconductor chip.

2. Description of the Related Art

A chip size package is a semiconductor device, the size of which is substantially the same as that of a semiconductor chip. Therefore, the chip size package is characterized in that the mount area can be remarkably reduced. In this chip size package, it is necessary to provide an arrangement by which thermal stress generated between the mount substrate and the semiconductor chip is reduced. Accordingly, various arrangements to reduce the thermal stress have been proposed.

Electrode terminals of the semiconductor chip are very fine and arranged very densely. On the other hand, external connection terminals such as solder balls are larger than the electrode terminals. Therefore, it is necessary to arrange the external connection terminals in such a manner that the arranging intervals of the external connection terminals are longer than those of the electrode terminals, and the external connection terminals are usually arranged on the overall electrode terminal carrying surface in the formation of an area array.

FIG. 22 is a view showing an example of the arrangement of the electrode terminals 12 of the semiconductor chips 10 and also showing an example of the arrangement of the lands 14 to which the external connection terminals such as solder balls are joined. The lands 14 are arranged in such a manner that the arranging intervals of the lands 14 are longer than those of the electrode terminals 12, and the electrode terminals 12 and the lands 14 are electrically connected with each other by the wiring sections 16.

When the land 14 is connected to the external connection terminal, it is common to adopt an arrangement having a cushioning function which is composed in such a manner that, for example, a metal post is vertically attached onto the land 14 and the external connection terminal is joined to an upper end portion of the metal post. Also, the following arrangement is adopted. On an electrode terminal carrying surface of the semiconductor chip, there is provided a buffer layer for reducing thermal stress, and a land of the wiring pattern film, which has been made to adhere via the buffer layer, is joined to the external connection terminal such as a solder ball, so that the cushioning function can be provided.

In the case of a circuit substrate on which a flip chip type of semiconductor chip is mounted, or in the case of a mount substrate on which a surface mount device such as a chip size package is mounted, the connection electrodes such as solder bumps are very densely arranged. Therefore, it is impossible to electrically connect all the connection electrodes to the wiring patterns when the wiring layer is formed into a single layer. For the above reasons, the wiring patterns are formed into a multiple layers in the above cases.

In order to form the circuit substrate into a multiple layers, there is provided a buildup method in which wiring patterns, which are interposed between insulating layers, are electrically connected with each other while the insulating layers are being successively laminated so that a multiple layer can be formed. Also, there is provided a method in which a multilayer of circuit substrates, on which the vias and the wiring pattern are previously formed, are laminated on each other so that a multiple layer can be formed.

In this connection, in order to manufacture a semiconductor device having a fine pattern such as a chip size package, it is necessary to conduct machining with high accuracy.

For example, in the case where wiring is conducted on the electrode terminal carrying surface of the semiconductor chip so as to form the connection electrode having a predetermined pattern and an external connection terminal is joined to the connection electrode, it is necessary to conduct fine machining in which metal posts for supporting the external connection terminals are formed. In the case where an insulating layer having a wiring pattern, which is also used as a buffer layer, is formed on the electrode terminal carrying surface of the semiconductor chip, it is necessary to provide a wire bonding process or a lead bonding process for electrically connecting the electrode terminals of the semiconductor chip with the wiring patterns.

SUMMARY OF THE INVENTION

The present invention has been accomplished to solve the above problems caused when the surface mount devices such as a semiconductor chip and a chip size package are mounted. It is an object of the present invention to provide a sheet of metal foil having bumps, a circuit substrate having the sheet of metal foil, and a semiconductor device having the circuit substrate capable of easily obtaining a mount structure in which the external connection terminals and the connection electrodes can be electrically connected with each other even when the external connection terminals, which are electrically connected to the electrode terminals, are formed on the electrode terminal carrying surface of the semiconductor chip.

In order to accomplish the above object, the present invention is composed as follows.

The present invention provides a sheet of metal foil having bumps characterized in that: bumps, which are electrically connected to connection electrodes provided on one face of a surface mount device such as a semiconductor chip or a chip size package, are arranged in the same plane arrangement as that of said connection electrodes, and protruded onto one side of said sheet of metal foil.

Also, the present invention provides a sheet of metal foil having bumps, wherein lands to which the external connection terminals are joined, which respectively correspond to the bumps, are formed on the other side of said sheet of metal foil.

Also, the present invention provides a sheet of metal foil having bumps, wherein wiring patterns are formed for electrically connecting the bumps to the lands with each other, to which the external connection terminals are joined, and are supported on supporters which couple adjacent wiring patterns.

Also, the present invention provides a sheet of metal foil having bumps, wherein the external connection terminals respectively corresponding to the bumps are formed on the other side of said sheet of metal foil being protruded.

Also, the present invention provides a sheet of metal foil having bumps, wherein wiring patterns are formed for electrically connecting the bumps to the external connection terminals with each other, and are supported on supporters which couple adjacent wiring patterns.

Also, the present invention provides a sheet of metal foil having bumps, wherein the external connection terminals are made of conductive material different from that of said sheet of metal foil.

Also, the present invention provides a sheet of metal foil having bumps, wherein an insulating adhesive agent layer is formed on one side of said sheet of metal foil.

Also, the present invention provides a sheet of metal foil having bumps, wherein tips of the bumps are protruded from a surface of the insulating adhesive agent layer.

Also, the present invention provides a sheet of metal foil having bumps, wherein a carrier tape is made adhere onto the other side of said sheet of metal foil.

Also, the present invention provides a circuit substrate of a multiple layer characterized in that: bumps, which are electrically connected to connection electrodes provided on one face of a surface mount device such as a semiconductor chip or a chip size package, are arranged in the same plane arrangement as that of said connection electrodes and protruded onto one side of the sheet of metal foil; on which wiring patterns, which are electrically connected to the said bumps with each other, are formed; and an insulating adhesive agent layer is made to adhere onto one face of the sheet of metal foil having bumps.

Also, the present invention provides a circuit substrate of a single or multiple layer, wherein the wiring pattern is an island-shaped wiring pattern having a land to which an external connection terminal is joined at a base portion of the bump.

Also, the present invention provides a circuit substrate of a single or multiple layer, wherein the wiring pattern is a wiring pattern having a land to which the external connection terminal is joined on the other end side of the bump.

Also, the present invention provides a circuit substrate of a single or multiple layer characterized in that: bumps, which are electrically connected to connection electrodes provided on one face of a surface mount device such as a semiconductor chip or a chip size package, are arranged in the same plane arrangement as that of said connection electrodes and protruded onto one side of the sheet of metal foil; external connection terminals respectively corresponding to said bumps are protruded onto the other side of said sheet of metal foil; on which wiring patterns are formed for electrically connecting the bumps to said external connection terminals with each other; and an insulating layer is made to adhere onto said one side of the sheet of metal foil having bumps.

Also, the present invention provides a circuit substrate of a single or multiple layer, wherein the external connection terminals are made of conductive material different from that of the sheet of metal foil.

Also, the present invention provides a circuit substrate of a single or multiple layer, wherein the conductive material is made of conductive paste.

Also, the present invention provides a circuit substrate of a single or multiple layer, wherein tips of the bumps are protruded from a surface of the insulating adhesive agent layer.

Also, the present invention provides a semiconductor device characterized in that: a circuit substrate of a single or multiple layer which is composed in such a manner that, bumps, which are electrically connected to connection electrodes provided on one face of a surface mount device such as a semiconductor chip or a chip size package, are arranged in the same plane arrangement as that of said connection electrodes and protruded onto one side of the sheet of metal foil; on which wiring patterns, which are electrically connected to the said bumps with each other, are formed; and an insulating adhesive agent layer is made to adhere onto said one side of the sheet of metal foil having bumps, is made to adhere onto said one face of the surface mount device by said insulating adhesive agent layer; and tips of the bumps respectively come into contact with the connection electrodes.

Also, the present invention provides a semiconductor device, wherein the wiring pattern is an island-shaped wiring pattern having a land to which the external connection terminal is joined at a base portion of the bump.

Also, the present invention provides a semiconductor device, wherein the wiring pattern is a wiring pattern having a land to which the external connection terminal is joined on the other end side of the bumps.

Also, the present invention provides a semiconductor device, wherein the external connection terminals are joined to the lands.

Also, the present invention provides a semiconductor device characterized in that: a circuit substrate of a single or multiple layer which is composed in such a manner that, bumps, which are electrically connected to connection electrodes provided on one face of a surface mount device such as a semiconductor chip or a chip size package, are arranged in the same plane arrangement as that of said connection electrodes and protruded onto one side of the sheet of metal foil; on which wiring patterns are formed for electrically connecting said bumps to external connection terminals with each other; which respectively correspond to the bumps and are protruded onto the other side of the sheet of metal foil; and an insulating adhesive agent layer is made to adhere onto said one face of the sheet of metal foil having bumps, is made to adhere onto said one face of the surface mount device by said insulating adhesive agent layer; and tips of the bumps respectively come into contact with the connection electrodes.

Also, the present invention provides a semiconductor device, wherein the outside of the external connection terminals are plated with solder.

Also, the present invention provides a semiconductor device, wherein the external connection terminals are made of conductive material different from that of the sheet of metal foil.

The sheet of metal foil having bumps, the circuit substrate having the sheet of metal foil, and the semiconductor device having the circuit substrate of the present invention can provide the following advantages. Even when the connection electrodes of the surface mount device such as a semiconductor chip or a chip size package are very densely arranged, it is possible to electrically connect the external connection terminals to the connection electrodes without extending the mount area.

The present invention can also provide the following advantages. Since bumps are formed on a sheet of metal foil by press working, the sheet of metal foil having the bumps according to the present invention can be suitably mass-produced, and the manufacturing cost can be reduced. Further, it is possible to easily make a circuit substrate having bumps arranged very densely.

Also, the present invention can provide the following advantages. The circuit substrate according to the present invention, which has the adhesive agent layer provided on the sheet of metal foil having bumps, can be made to adhere onto the electrode terminal carrying surface of the semiconductor chip. Therefore, the semiconductor device can be easily manufactured.

Further, the semiconductor device according to the present invention can be easily manufactured. Furthermore, thermal stress generated by a difference of the coefficient of thermal expansion between the mount substrate and the semiconductor chip can be effectively reduced by the adhesive agent layer. Therefore, it is possible to conduct mounting very reliably.

DESCRIPTION OF THE PREFERRED EMBODIMENTS

Referring to the appended drawings, the preferred embodiments of the present invention will be explained in detail as follows.

Semiconductor Device

Figure 1:
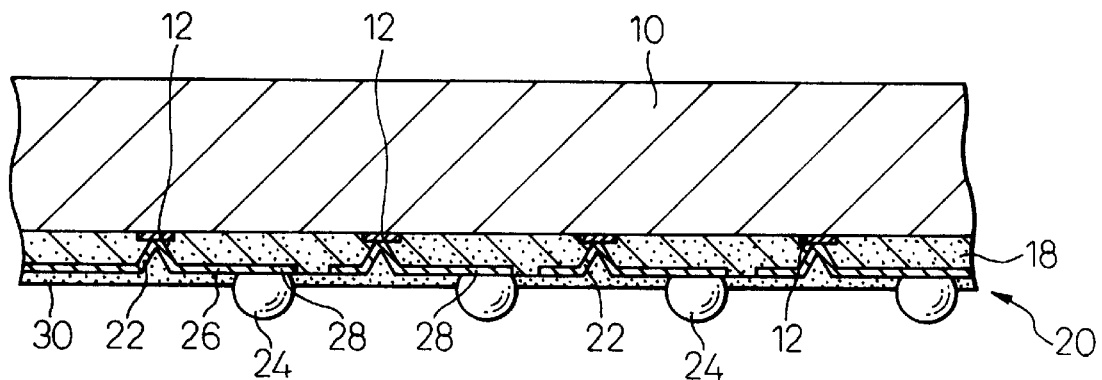
FIG. 1 is a cross-sectional view showing an embodiment of the semiconductor device.
Figure 2:
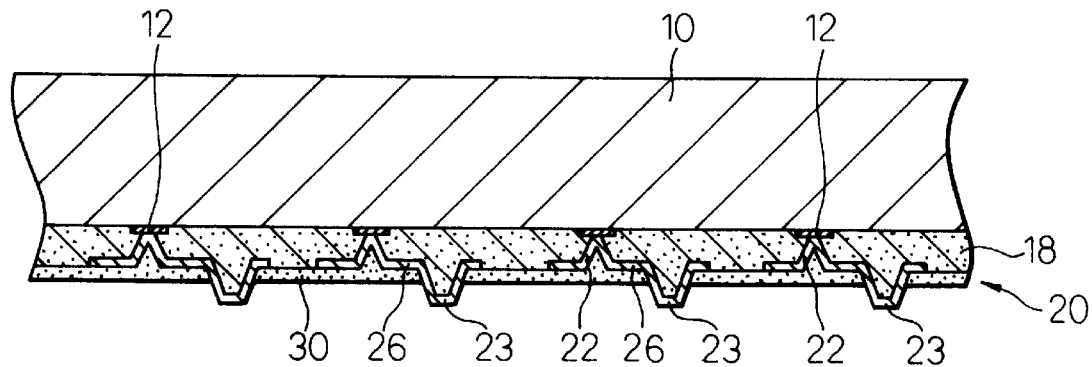
FIG. 2 is a cross-sectional view showing another embodiment of the semiconductor device.
Figure 3:
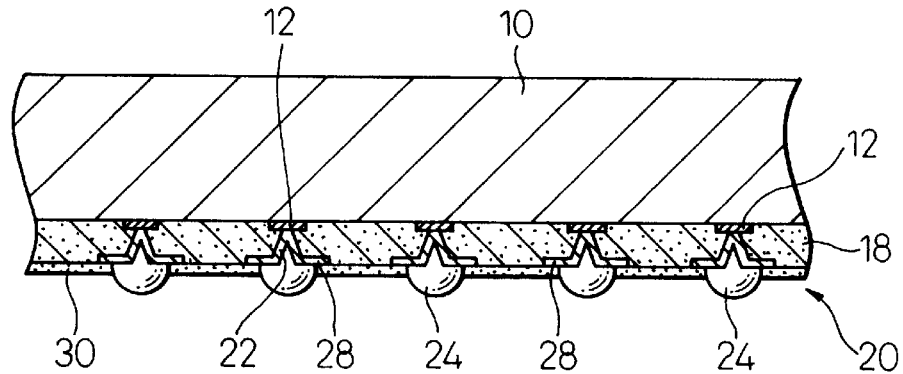
FIG. 3 is a cross-sectional view showing still another embodiment of the semiconductor device.

FIGS. 1 to 3 are cross-sectional views respectively showing an arrangement of the semiconductor device manufactured by using a sheet of metal foil 20 having bumps.

FIG. 1 is a cross-sectional view showing a semiconductor device manufactured in such a manner that the sheet of metal foil 20 having bumps is made to adhere onto an electrode terminal carrying surface of the semiconductor chip 10 via the adhesive agent layer 18. This sheet of metal foil 20 having bumps used for the semiconductor device is composed in such a manner that the bumps 22 are formed on the sheet of metal foil in the same plane arrangement as that of the electrode terminals 12 formed on the electrode terminal carrying surface. As shown in the drawings, the sheet of metal foil 20 having bumps is made to adhere onto the electrode terminal carrying surface of the semiconductor chip 10 via the adhesive agent layer 18 under the condition that each forward end portion of the bump 22 comes into contact with each electrode terminal 12.

On the sheet of metal foil 20, there are provided wiring patterns 26 for electrically connecting each bump 22 to each external connection terminal 24. The bump 22 is formed on one end side of the wiring pattern 26, and the land 28 for joining the external connection terminal 24 is formed on the other end side of it. In the embodiment shown in FIG. 1, solder balls are used for the external connection terminals 24. Each bump 22 is formed into a configuration, the size of which is minute, so that the bump 22 can be connected to the electrode terminal 12. On the other hand, the land 28 is formed into a configuration, the size of which is a predetermined value, so that the land 28 can be joined to an external connection terminal such as a solder ball.

In the above embodiment, the external surface of the sheet of metal foil 20 having bumps is covered with the protective film 30 of solder resist so that only the lands 28 can be exposed.

When the semiconductor device shown in FIG. 1 is mounted on a mount substrate, the external connection terminal 24 is joined to a connecting section of the circuit pattern provided on the mount substrate. The adhesive agent layer 18 has a function of making the sheet of metal foil 20 having bumps adhere to the semiconductor chip 10. Also, the adhesive agent layer 18 has a function of reducing thermal stress generated between the mount substrate and the semiconductor element 10.

In this connection, the semiconductor device may be composed in such a manner that the external connection terminal 24 is not joined to the land 28 but the land 28 is left being exposed and a connection bump provided on the mount substrate is joined to the land 28.

The semiconductor device shown in FIG. 2 is characterized in that both the bumps 22 and the external connection terminals 23 are previously formed on the sheet of metal foil. On the sheet of metal foil 20 having bumps, the protruding connection terminals 23 are formed by press working so that the protruding connection terminals 23 can agree with the positions of the connecting portions of the wiring patterns provided on the mount substrate. Each bump 22 is electrically connected to each connection terminal 23, so that the wiring pattern 26 can be formed.

When the connection terminals 23 are formed being protruded as shown in FIG. 2, the semiconductor device can be manufactured by positioning and soldering the connection terminals 23 and the connecting sections of the mount substrate. In this connection, when the external faces of the connection terminals 23 are previously plated with solder, mounting can be easily carried out.

When the sheet of metal foil 20 having bumps, on which the protruding connection terminals 23 are formed as shown in FIG. 2, is used, it is possible to provide an advantage that mounting can be carried out without using the external connection terminals 24 such as solder balls. When the bumps 22 and the connection terminals 23 are formed on the sheet of metal foil by press working, the sheet of metal foil 20 having bumps can be manufactured at low cost.

FIG. 3 is a cross-sectional view showing still another embodiment of the semiconductor device. In this embodiment, the wiring patterns are not drawn around, and the lands 28 are provided in the same plane arrangement as that of the electrode terminals 12 of the semiconductor chips 10, and the external connection terminals 24 are joined to the lands 28. A base portion of each bump 22 is formed into an independent island-shape, and an external face of the base portion of the bump 22 is formed onto the land 28 to which the external connection terminal 24 is joined. Also, in this embodiment, each wiring pattern 26 is composed of the bump 22 and the land 28.

On the external face of the base portion of the bump 22, there is provided a recess which is formed when the bump 22 is formed into a protruding shape. This recess is filled with solder when the external connection terminal 24 such as a solder ball is joined to the recess. Except for the lands 28, the external face of the sheet of metal foil 20 having bumps is covered with a protective film 30 made of solder resist.

When the plane arrangement of the electrode terminals 12 and that of the external connection terminals 24 are made to be the same as shown in this embodiment, the bump 22 can be formed into a minute configuration so that it can be connected to the electrode terminal 12, and on the other hand, the land 28 is provided with a necessary area so that it can be joined to the external connection terminal 24. Therefore, the bump 22 and the land 28 have a function of converting the size of the electrode terminal 12 into the size of the external connection terminal 24. The aforementioned function of converting the size of the electrical connecting section is useful, because it becomes possible to connect a larger external connection terminal 24 to the land 28 in the same arrangement even when the electrode terminal 12 is formed into a minute configuration. Since the adhesive agent layer 18 is interposed in this embodiment, it is possible to reduce thermal stress generated in the case of mounting.

In the semiconductor devices of the aforementioned embodiments shown in FIGS. 1 to 3, the bumps 22 on the sheet of metal foil are connected to the electrode terminals 12 provided on the electrode terminal carrying surface of the semiconductor chip 10. However, it is possible to adopt an arrangement in which the bumps 22 are connected to the connection electrodes formed by rewiring on the electrode terminal carrying surface of the semiconductor chip 10.

Rewiring is conducted in the case where the electrode terminals 12 are very densely arranged, so that the bumps 22 can not be connected to the electrode terminals 12 as they are. Also, rewiring is conducted in the case where the connection electrodes for connecting the bumps 22 are arranged according to the arrangement of the external connection terminals 24. In the case of the semiconductor chip 10 in which the connection terminal is formed by rewiring on the electrode terminal carrying surface, it is possible to provide a semiconductor device capable of being mounted when the sheet of metal foil 20 having bumps is made to adhere by the adhesive agent layer 18 and the bumps 22 are connected to the connection electrodes.

Sheet of Metal Foil Having Bumps

FIGS. 4 to 7 are views showing embodiments of the sheet of metal foil having bumps.

Figure 4:
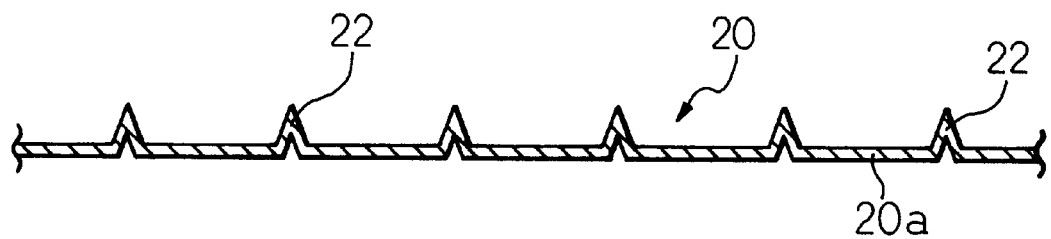
FIG. 4 is a cross-sectional view showing an embodiment of the sheet of metal foil having bumps.

FIG. 4 is a view showing a sheet of metal foil 20, on one face 20a of which the bumps 22 are formed in the same arrangement as that of the electrode terminals of the connection electrodes provided on the surface mount device such as a semiconductor chip 10 or a chip size package.

On this sheet of metal foil 20 having bumps, the protruding bumps 22 are formed when a flat sheet of metal foil 20a is subjected to press working. The method of forming the bumps 22 by press working is advantageous in that a large number of bumps 22 can be effectively formed, so that the sheets of metal foil 20 having bumps can be easily manufactured and mass-produced.

Figure 8:
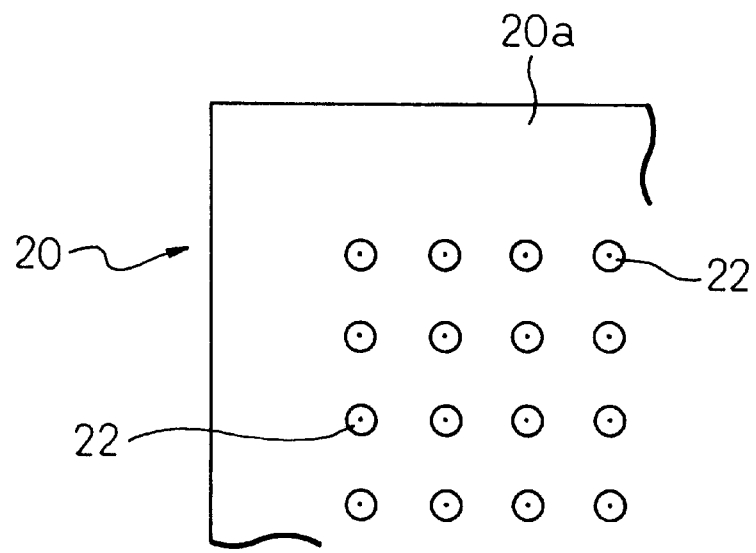
FIG. 8 is a plan view showing a plane arrangement of the bumps.

FIG. 8 is a view showing an example of the plane arrangement of the bumps 22 provided on the sheet of metal foil. The bumps 22 are formed according to the arrangement of the connection electrodes such as the electrode terminals 12 formed on the electrode terminal carrying surface of the semiconductor chip 10. For example, when the electrode terminals 12 are arranged in the shape of an area array, the bumps 22 are also arranged in the shape of an area array as shown in the drawing.

The configuration of each bump 22 formed on the sheet of metal foil may be a configuration by which the bump 22 can be contacted with and electrically connected to the connection electrode provided on surface mount device such as a semiconductor chip or a chip size package.

Figure 10:
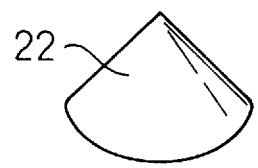
FIGS. 10(a1) to 10(d2) are perspective views and cross-sectional views showing examples of the bumps.
Figure 10:
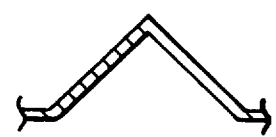
Figure 10:
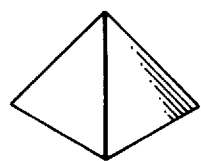
Figure 10:
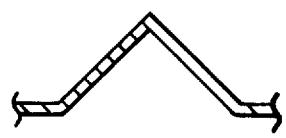
Figure 10:
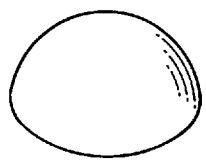
Figure 10:
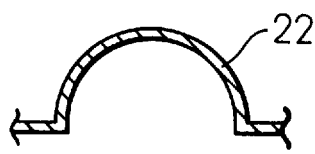
Figure 10:
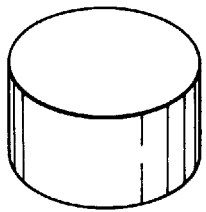
Figure 10:
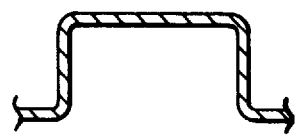
Figure 11:
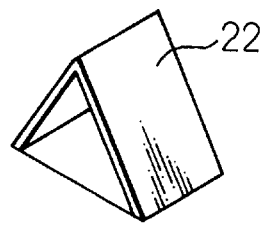
FIGS. 11(a1) to 11(d2) are perspective views and cross-sectional views showing another example of the bumps.
Figure 11:
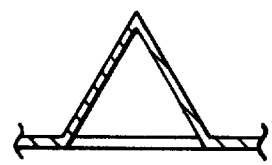
Figure 11:
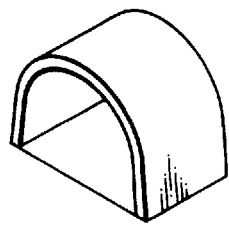
Figure 11:
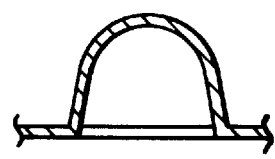
Figure 11:
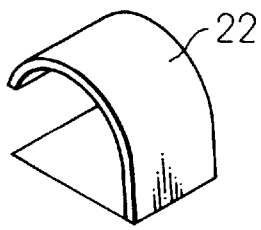
Figure 11:
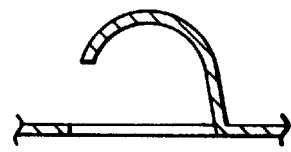
Figure 11:
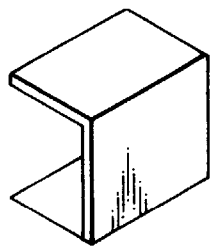
Figure 11:
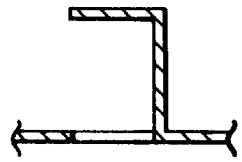
Figure 12:
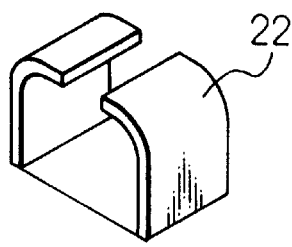
FIGS. 12(a1) to 12(c) are perspective views and cross-sectional views showing still another example of the bumps.
Figure 12:
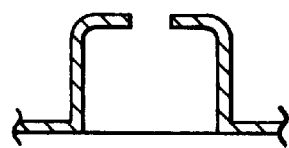
Figure 12:
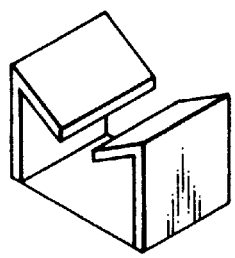
Figure 12:
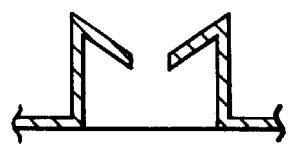

FIG. 4 is a view showing an example of the sheet of metal foil 20 having bumps which are formed conical. However, it is possible to form the bumps 22 into various configurations. FIGS. 10 to 12 are perspective and cross-sectional views of the bumps 22 formed on the sheet of metal foil. FIGS. 10(*a*1) to 10(*d*2) are views showing examples of the configurations of the bumps 22 which are formed into a cone, pyramid, hemisphere and column. FIGS. 11(*a*1) to 11(*d*2) are views showing configurations of the bumps 22 which are raised by cutting. In these examples, the side configurations are formed into a V-shape, U-shape, J-shape and L-shape. FIGS. 12(*a*1) to 12(*b*2) are views of the configurations of the bumps, the side configurations of which are formed by combining two J-shape components opposed to each other and also by combining two sharp J-shape components opposed to each other. FIG. 12(*c*) is a view showing an example of the configuration of the bump which is formed into a spiral.

As shown in FIGS. 10(*a*1) to 10(*c*2), when the bump 22 is formed into a cone, pyramid or hemisphere, the configuration of the bump 22 can be stably maintained, and the positional accuracy can be enhanced. The bump 22 having a top in the configuration, such as the conical bump 22, is superior to the columnar bump 22 shown in FIGS. 10(*d*1) and 10(*d*2), because it is possible for the bump 22 having the top to conduct electrical connection by point contact, so that the connection electrodes can be very densely arranged, that is, the bump 22 having the top, including such as the conical bump 22, can be easily joined to the connection electrode. In this connection, in the examples shown in FIGS. 10(*a*1) to 10(*d*2), it is possible to form a through-hole at the top of the bump 22.

Figure 12C:
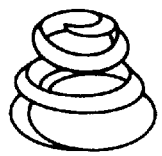

When the bumps 22 are formed by being raised by cutting as shown in FIGS. 11 and 12, the sides of the bumps 22 are open. Especially, in the cases shown in FIGS. 11(*c*1) and 11*c*2) and also shown in FIGS. 11(*d*1) and 11(*d*2), in which the bumps 22 are formed into a J-shape, L-shape or sharp J-shape and one of the base portions supporting the bump 22 is separate from the sheet of metal foil, elasticity is given to the bump 22. Due to the elasticity of the bump 22, thermal stress generated in the process of mounting on a mount substrate can be reduced by the bump 22. In the case of the spiral bump 22 shown in FIG. 12(c), the elasticity and cushioning function of the bump 22 can be further enhanced, and thermal stress can be more effectively reduced.

The sheet of metal foil 20 having bumps can be made of metal such as copper, aluminum, gold, silver or stainless steel. When the bumps 22 are formed on the sheet of metal foil 20a by press working, the prior art of press working in which a die and punch are used can be applied. When a metal sheet is subjected to press working, it is possible to provide a very high accuracy of forming. Therefore, minute bumps 22 can be easily formed according to the arrangement of the connection electrodes. In this connection, in the case where the bumps 22 are formed on the sheet of metal foil 20a, it is possible to form the bumps 22 of the same configuration on the overall sheet of metal foil 20a. It is also possible to form bumps 22 of different configurations which are arranged on the sheet of metal foil 20a being mixed with each other.

Figure 5:
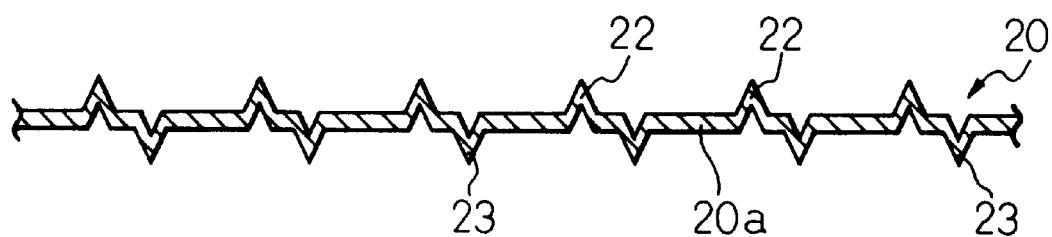
FIG. 5 is a cross-sectional view showing another embodiment of the sheet of metal foil having bumps.

FIG. 5 is a view showing a sheet of metal foil 20 having both the bumps 22 and the connection terminals 23 used as external connection terminals. That is, on the sheet of metal foil 20a, the bumps 22 and the connection terminals 23 are formed by press working. Since the connection terminals 23 are used as external connection terminals, they are formed being protruded onto the opposite side to the side on which the bumps 22 are formed on the sheet of metal foil 20a. As shown in FIGS. 10 to 12, the connection terminals 23 may be formed into various configurations. However, since the connection terminals 23 are connected to the connecting sections of the mount substrate by solder, it is preferable that the configuration of each connection terminal 23 is formed so that a predetermined joining area can be ensured.

In this connection, instead of forming the connection terminals 23 by press working, a conductor having bumps, which is different from the sheet of metal foil 20a, may be formed on the face of the sheet of metal foil 20a onto which the external connection terminals are connected, so that the conductor can be used as the connection terminals 23. Examples of the methods of forming the connection terminals 23 by the different conductor are: a method in which the connection terminals are made to swell by plating; and a method in which the connection terminals are formed into bumps by printing or transferring conductor paste.

When the above sheet of metal foil 20 having bumps provided with the external connection terminals 23 is used, it becomes unnecessary to join the external connection terminals such as solder balls in the later process.

Figure 6:
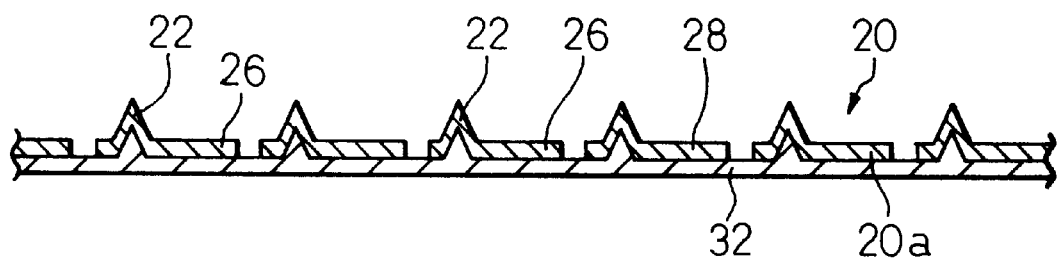
FIG. 6 is a cross-sectional view showing still another embodiment of the sheet of metal foil having bumps.
Figure 7:
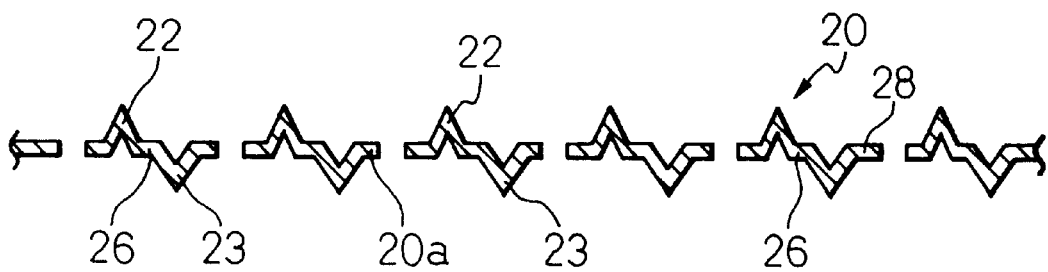
FIG. 7 is a cross-sectional view showing still another embodiment of the sheet of metal foil having bumps.
Figure 9:
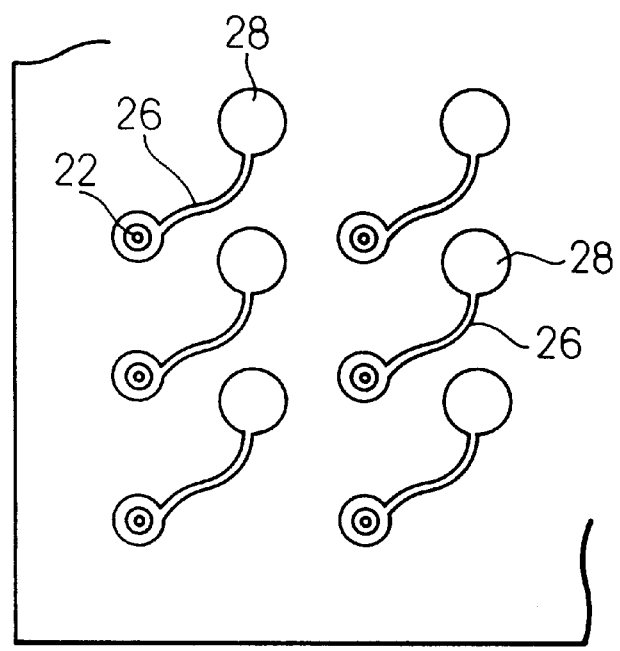
FIG. 9 is a plan view showing a plane arrangement of the bumps, lands and wiring patterns.

The sheet of metal foil 20 shown in FIGS. 6 and 7 is characterized in that the wiring patterns 26 for electrically connecting the bumps 22 with the external connection terminals are formed. FIG. 9 is a view showing the wiring patterns 26 including the bumps 26 and the lands 28. Each wiring pattern 26 is formed being drawn on a plane so that the bump 22 and the land 28, to which the external terminal is joined, can be electrically connected with each other. In order to independently form the bump 22, the land 28 and the wiring pattern 26 for connecting them, it is preferable that the wiring pattern 26 is supported by the carrier tape 32 capable of being peeled off from the sheet of metal foil 20a as shown in FIG. 6.

FIG. 7 is a view showing a sheet of metal foil 20 having bumps on which the wiring patterns 26 for connecting the bumps 22 to the connection terminals 23 are formed. In the case of this sheet of metal foil 20 having bumps, the wiring patterns 26 can be connected to and supported by the support frame without using the above carrier tape 32.

In this connection, in the case where the bumps 22 are formed by press working on the sheet of metal foil 20a, it is possible to form the bumps 22 after the sheet of metal foil 20a has been patterned.

Circuit Substrate

As shown in FIGS. 1 to 3, the sheet of metal foil 20 having bumps can be attached onto the electrode terminal carrying surface of the semiconductor chip 10 or the electrode terminal carrying surface of the surface mount device such as a chip size package. In this way, the sheet of metal foil 20 having bumps can be used for composing a predetermined mount structure of the semiconductor device.

When the sheet of metal foil 20 having bumps is attached to the electronic device such as a semiconductor chip 10 as described above, it is attached via the adhesive agent layer 18. Therefore, it is effective to previously provide the adhesive agent layer 18 on the sheet of metal foil 20 having bumps.

FIGS. 13 to 16 are views showing examples of the sheet of metal foil 20 having bumps on which the adhesive agent layer 18 is provided.

Figure 13:
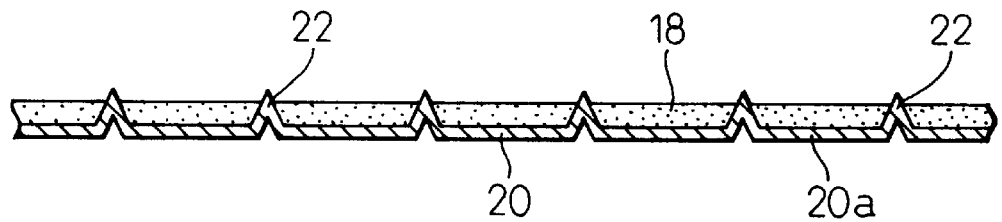
FIG. 13 is a cross-sectional view showing an embodiment of the circuit substrate.

FIG. 13 is a view showing the sheet of metal foil 20 having bumps, on one face of the sheet of metal foil 20a of which the protruding bumps 22 are formed and the adhesive agent layer 18 is provided. In this case, the adhesive agent layer 18 is provided so that all of the one face of the sheet of metal foil 20 having bumps can be covered with the adhesive agent layer 18. In this connection, in the case where one face of the sheet of metal foil 20 having bumps on which the bumps 22 are formed is covered with the adhesive agent layer 18 and the tip portions of the bumps 22 are protruded from the surface of the adhesive agent layer 18, the following two cases may be encountered. One is a case in which the tip portions of the bumps 22 and the surface of the adhesive agent layer 18 are made to be on the same face, and the surfaces of the bump 22 are exposed from the surface of the adhesive agent layer 18. The other is a case, the tip portions of the bumps 22 are embedded in the adhesive agent layer 18.

In the case where the tip portions of the bumps 22 are protruded or exposed from the adhesive agent layer 18, the sheet of metal foil 20 having bumps can be electrically connected to the connection electrodes such as the electrode terminals 12 provided in the electronic part such as the semiconductor chip 10 as they are.

Even if the bumps 22 are embedded in the adhesive agent layer 18, when the sheet of metal foil 20 having bumps is made to adhere onto the adhesive face while they are being strongly pressed against the adhesive face, the tip portions of the bumps 22 can be protruded from the adhesive agent layer 18, so that the tip portions of the bumps 22 can be pressed against the connection electrodes such as the electrode terminals 12. In this way, the electrical connection can be accomplished.

Figure 14:
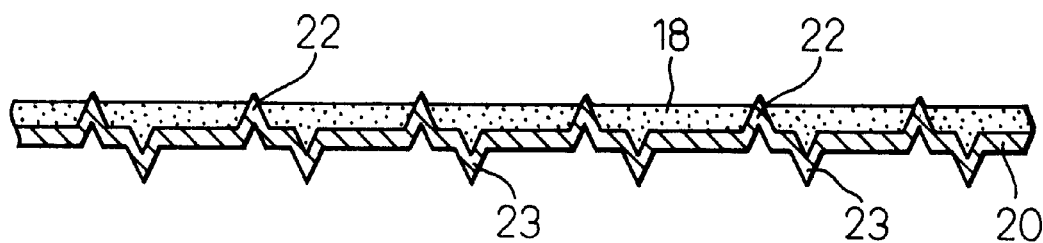
FIG. 14 is a cross-sectional view showing another embodiment of the circuit substrate.

FIG. 14 is a view showing an embodiment of the sheet of metal foil 20 having bumps on which the bumps 22 and the connection terminals 23 are provided, and the adhesive agent layer 18 is provided on the face of the sheet of metal foil 20 on which the bumps 22 are formed.

Figure 15:
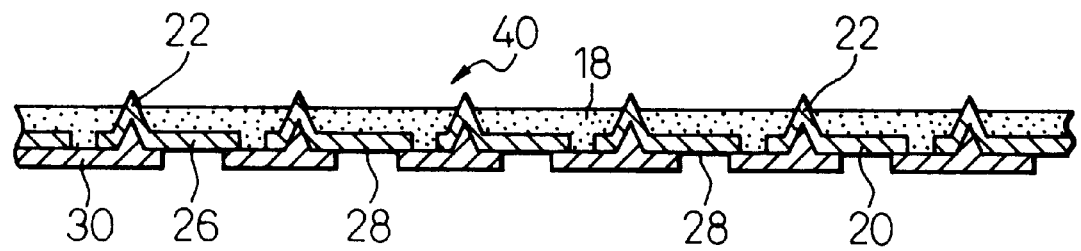
FIG. 15 is a cross-sectional view showing still another embodiment of the circuit substrate.

FIG. 15 is a view showing a circuit substrate 40 which has the adhesive agent layer 18 covering the bump carrying face of the sheet of metal foil 20 having bumps on which the wiring patterns 26 are formed.

Figure 16:
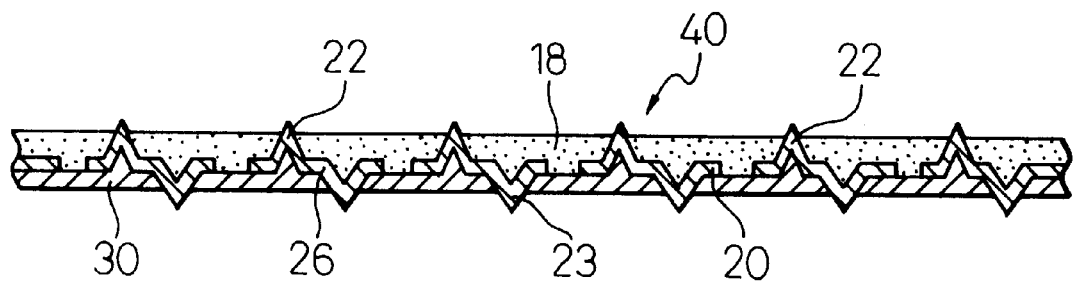
FIG. 16 is a cross-sectional view showing still another embodiment of the circuit substrate.

FIG. 16 is a view showing a circuit substrate 40 which has the adhesive agent layer 18 provided on the sheet of metal foil 20 having bumps on which the bumps 22, the connection terminals 23 and the wiring patterns 26 for electrically connecting them are formed. When the wiring patterns 26 are formed, the wiring patterns for electrically connecting the bumps 22 to the connection terminals 23 can be used as signal patterns, ground patterns or power supply patterns.

In this connection, in this specification, the circuit substrate 40 is defined as a sheet of metal foil 20 having bumps provided with the adhesive agent layer 18 on which the wiring patterns 26 are formed on the sheet of metal foil 20a. Also, in this specification, the sheet of metal foil having bumps is defined as a sheet of metal foil 20 having bumps in which only bumps 22 are formed on the sheet of metal foil 20a and no wiring patterns 26 are formed.

Concerning the form of the sheet of metal foil 20 having bumps provided with the adhesive agent layer 18 and also concerning the form of the circuit substrate 40, it is possible to adopt various forms as described before according to the configurations of bumps 22 provided on the sheet of metal foil 20 having bumps, the configurations of the connection terminals 23, and/or the wiring patterns 26. As long as a predetermined adhesion function can be provided by the adhesive agent layer 18 adhering to the sheet of metal foil 20 having bumps, any adhesive agent layer 18 may be adopted. Either thermosetting resin or thermoplastic resin may be used, that is, the material is not particularly restricted.

As shown by the embodiments illustrated in FIGS. 13 and 14, the sheet of metal foil 20 having bumps and the circuit substrate 40 may be provided in such a manner that all face on the mount face side is exposed. Alternatively, as shown by the embodiments illustrated in FIGS. 15 and 16, the sheet of metal foil 20 having bumps and the circuit substrate 40 may be provided in such a manner that the mount face side is covered with the protective film 30 made of solder resist. In the case where the mount face side of the circuit substrate 40 is covered with the protective film 30, the lands 28 to which the external connection terminals are joined are exposed, or the connection end portions of the connection terminals 23 are exposed.

On the circuit substrate 40, it is preferable that the connection end portions of the lands 28 with the connection terminals 23 are plated by nickel-gold alloy so that the connection end portions can be excellently joined to the external connection terminals. In the case of plating by nickel-gold alloy, the mount face side of the sheet of metal foil 20a may be covered with the protective layer 30 made of solder resist, and electrolytic plating may be conducted under this condition.

On the sheet of metal foil 20 having bumps provided with the adhesive agent layer 18 and also on the circuit substrate 40, the tip portions of the bumps 22 exposed onto the surface of the adhesive agent layer 18 may be subjected to plating of gold, tin, lead or silver, or alternatively the tip portions of the bumps 22 exposed onto the surface of the adhesive agent layer 18 may be coated with conductive material such as silver paste, so that the tip portions of the exposed bumps 22 can be electrically connected with the connection electrodes provided in the electronic part such as a semiconductor chip.

Method of manufacturing the circuit substrate and others

Methods of manufacturing the above circuit substrate 40 and the sheet of metal foil 20 having bumps provided with the adhesive agent layer 18 are divided into two main methods. One is a method in which, before a predetermined wiring pattern is formed on the sheet of metal foil 20a, one face, on which the bumps are formed, of the sheet of metal foil 20a is covered with the adhesive agent layer 18. The other is a method in which, after a predetermined wiring pattern has been formed on the sheet of metal foil 20a, one face of the sheet of metal foil 20a is covered with the adhesive agent layer 18.

The method in which one face, on which the bumps are formed, of the sheet of metal foil 20a is covered with the adhesive agent layer 18 before a predetermined wiring pattern is formed on the sheet of metal foil 20a, is divided into the following two methods (1) and (2).

Method (1) is described as follows. The sheet of metal foil 20a is subjected to press working so as to form the bumps 22. After that, the face on which the bumps 22 have been formed are covered with the adhesive agent layer 18. Then, the wiring patterns are formed.

Figure 17:
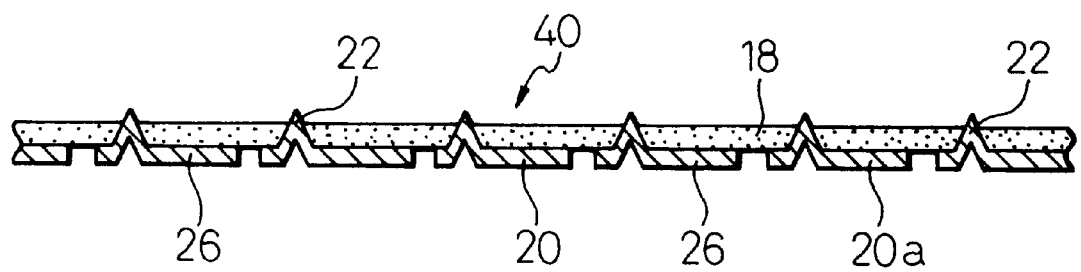
FIG. 17 is a cross-sectional view showing still another embodiment of the circuit substrate.

On the sheet of metal foil 20 having bumps provided with the adhesive agent layer shown in FIG. 13, when the sheet of metal foil 20a is etched, it is possible to obtain the circuit substrate 40 having the wiring pattern 26 shown in FIG. 17. Since the sheet of metal foil 20a is supported by the adhesive agent layer 18, it is possible to form an arbitrary wiring pattern.

The sheet of metal foil 20 having bumps shown in FIG. 13, on which the wiring patterns have not been formed yet, can be made by the following methods. One is a method in which liquid of insulating resin, which becomes the adhesive agent layer 18, is coated on the sheet of metal foil 20a on which the bumps 22 are formed. The other is a method in which an adhesive agent sheet having a function of adhesion is made to adhere.

As described above, the tip portions of the bumps 22 are exposed onto the surface of the adhesive agent layer 18 or embedded in the adhesive agent layer 18. In order to expose the tip portions of the bumps 22 from the surface of the adhesive agent layer 18, after liquid resin is coated on the surface of the sheet of metal foil 20a, or alternatively after the adhesive agent sheet is made to adhere, a pressing jig having a flat face is pressed on the adhesive agent layer 18 in the thickness direction of it, so that the tip portions of the bumps 22 can be exposed onto the surface of the adhesive agent layer 18. If the pressing jig is made of material having a cushioning function and also if the surface of the pressing jig for pressing the adhesive agent layer 18 is made to be separable, it becomes possible to protrude the tip portions of the bumps 22 from the surface of the adhesive agent layer 18. In this connection, when pressing is conducted by the pressing jig, the adhesive agent layer 18 may be heated a little so as to ensure the configuration.

Method (2) is described as follows. After the adhesive agent layer 18 has been made to adhere onto one face of the sheet of metal foil 20a, the bumps 22 are formed, and then the wiring patterns are formed.

According to this method, when the bumps 22 are formed by press working on the sheet of metal foil 20a, the bumps 22 are formed via the adhesive agent layer 18.

At this time, simultaneously when the bumps 22 are formed, the tip portions of the bumps 22 are exposed from the adhesive agent layer 18.

In this connection, when the sheet of metal foil 20a is subjected to press forming, it is possible to form a predetermined wiring pattern before the bumps 22 are formed. Since the sheet of metal foil 20a is supported by the adhesive agent layer 18, the predetermined wiring pattern may be formed on the sheet of metal foil 20*a* either before or after the bumps 22 are formed.

After the predetermined wiring pattern has been formed on the sheet of metal foil 20*a*, one face of the sheet of metal foil 20*a* is covered with the adhesive agent layer 18. In this case, the following methods (3) to (5) are provided.

Method (3) is described as follows. After the predetermined wiring patterns have been formed on the sheet of metal foil 20*a* and the bumps 22 have been formed, the bump carrying face is covered with the adhesive agent layer 18. According to this method, the predetermined wiring patterns are formed on the sheet of metal foil 20*a* under the condition that the adhesive agent layer 18 has not been formed. Therefore, it is necessary to form the wiring pattern while the sheet of metal foil 20*a* is being supported by the frame. After the wiring patterns 26, the configurations of which are established by themselves, have been formed as described above, liquid of insulating resin is coated on the bump carrying face, or alternatively an adhesive agent sheet is made to adhere, so that the adhesive agent layer 18 is provided. In this connection, the order of the process in which the predetermined wiring pattern is formed on the sheet of metal foil 20*a* and the process of forming the bumps 22 can be changed. Accordingly, it is possible to form the predetermined wiring patterns after the bumps 22 have been formed.

Method (4) is described as follows. After the predetermined wiring patterns have been formed on the sheet of metal foil 20*a*, one face of the sheet of metal foil 20*a* is covered with the adhesive agent layer 18, and press working is conducted on the sheet of metal foil 20*a* onto which the adhesive agent layer 18 is attached, so that the bumps 22 can be formed. According to this method, the predetermined wiring patterns are formed before the sheet of metal foil 20*a* is supported by the adhesive agent layer 18. Therefore, the wiring patterns, which are adjacent to each other, must be connected to with each other by a support piece.

Since the adhesive agent layer 18 is attached onto the sheet of metal foil 20*a*, the sheet of metal foil 20*a* is subjected to press working via the adhesive agent layer 18, so that the bumps 22 can be formed. At this time, the tip portions of the bumps 22 are exposed or embedded in the adhesive agent layer 18.

In this connection, in the case where the predetermined wiring patterns are formed on the sheet of metal foil 20*a* before the sheet of metal foil 20*a* is supported by the adhesive agent layer 18 as described above, the wiring patterns, which are adjacent to each other, must be connected to with each other by a support piece. However, when the sheet of metal foil 20*a* is previously supported by the carrier tape 32, it becomes possible to form arbitrary wiring patterns on the sheet of metal foil 20*a*.

Method (5) is described as follows. The carrier tape 32 is made to adhere onto a face of the sheet of metal foil 20*a* opposite to the face on which the bumps 22 are formed, so that the sheet of metal foil 20*a* can be supported. Under the above condition, the predetermined patterns are formed on the sheet of metal foil 20*a*, or alternatively press working is conducted.

In the method of supporting the sheet of metal foil 20*a* by the carrier tape 32, either the formation of predetermined patterns on the sheet of metal foil 20*a* or the press working may be conducted first. That is, after the wiring patterns 26 and the bumps 22 have been formed by forming the predetermined patterns on the sheet of metal foil 20*a* and conducting press working, the adhesive agent layer 18 is made to adhere onto the face on which the bumps 22 are formed.

As an alternative method, the predetermined wiring patterns are formed on the sheet of metal foil 20*a* under the condition that the sheet of metal foil 20*a* is supported by the carrier tape 32, and the adhesive agent layer 18 is provided on one face of the sheet of metal foil 20*a*, and then the bumps 22 are formed by press working.

The carrier tape 32 is provided for supporting the sheet of metal foil 20*a*. Therefore, the carrier tape 32 is selected so that it can be easily peeled off from the sheet of metal foil 20*a*. In the case of mounting, the carrier tape 32 is peeled off from the circuit substrate 40. In this connection, it is possible to adopt an arrangement in which the carrier tape 32 is made to adhere onto the face on which the adhesive agent layer 18 is provided or the mount face of the sheet of metal foil 20*a* in such a manner that the carrier tape 32 is separable so that it can be used for protecting the circuit substrate.

Multilayer Circuit Substrate

All of the aforementioned circuit substrates are composed of a single layer. However, it is possible to provide a multilayer circuit substrate by laminating circuit substrates 40 on which the adhesive agent layers 18 are provided on the faces on which the bumps 22 are formed.

Figure 18:
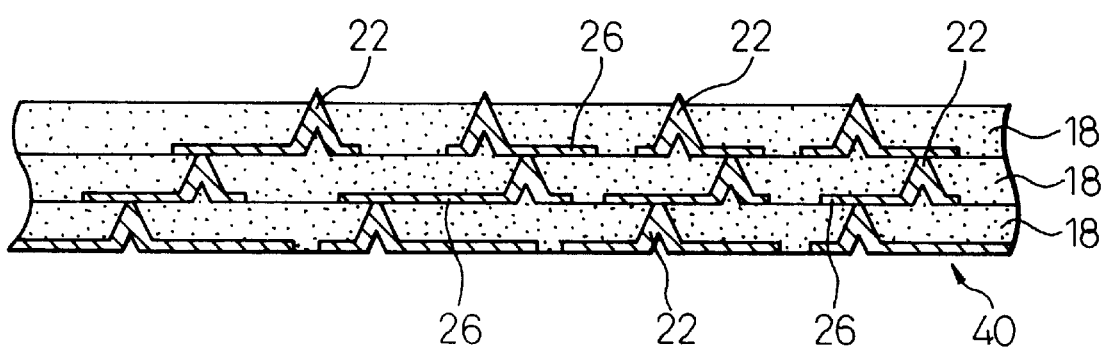
FIG. 18 is a cross-sectional view showing an embodiment of the multi-layer circuit substrate.

FIG. 18 is a view showing an embodiment of the multilayer circuit substrate. The circuit substrates 40 having the same wiring patterns 26 as those of the circuit substrate shown in FIG. 17 are laminated and adhere to each other by the adhesive agent layers 18, so that the multilayer circuit substrate can be obtained.

The bumps 22 formed on the circuit substrate 40 function as vias for electrically connecting the wiring patterns 26 between the layers, and when the wiring patterns 26 and the bumps 22 on the layers are appropriately arranged, it is possible to obtain a multilayer circuit substrate having a predetermined electrical connection pattern.

In the case where the circuit substrates 40 are laminated so as to form a multiple layer, it is common that the tip portions of the bumps 22 on the lower layer come into contact to the lower face of the wiring patterns 26 on the upper layer. However, depending upon a case, the bumps 22 on the lower layer and the bumps 22 on the upper layer may be located at the same positions on a plane. When there is a possibility that an electrical connection can not be positively accomplished between the layers because of recesses formed at the bottom portions of the bumps 22 on the upper layer, the recesses of the bumps 22 may be filled with conductive material so as to ensure the electrical connection.

When the circuit substrate 40 having a multiple layer is provided, it is possible to accomplish various arrangements which can not be provided by the circuit substrate of a single layer. For example, it is possible to provide a ground layer or a power supply layer on the circuit substrate.

Concerning the configurations of the bumps 22 provided on the circuit substrate 40 laminated into a multiple layer, it is possible to use various forms combined with each other as shown in FIGS. 10, 11 and 12.

Method of Manufacturing Semiconductor Devices

The adhesive agent layer 18 is previously formed on the above circuit substrate 40 of a single or multiple layer, and the bumps 22 are formed according to the arrangement of the connection electrodes provided in the electronic device such as a semiconductor chip or a chip size package. Therefore, when the semiconductor device is manufactured, the electrode terminal carrying surfaces of the semiconductor chip 10 and the bumps 22 of the circuit substrate 40 are positioned so as to agree with each other and made to adhere by the adhesive agent layer 18. Due to the foregoing, the bumps 22 and the electrode terminals 12 can be electrically connected to with each other. In this way, it is possible to manufacture a semiconductor device having the wiring patterns 26 used for external connection and the lands 28 on the electrode terminal carrying surfaces.

Figure 19:
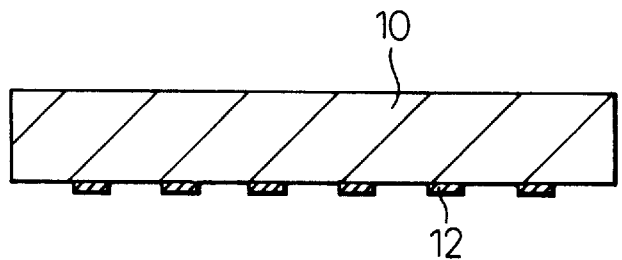
FIGS. 19(a1) to 19(c) are schematic illustrations showing a method of manufacturing the semiconductor device.
Figure 19:
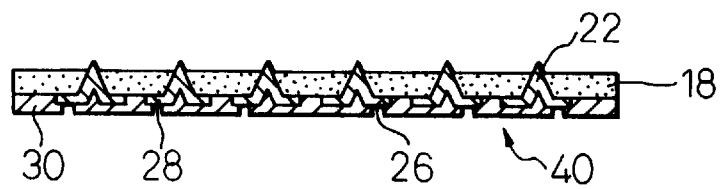
Figure 19B:
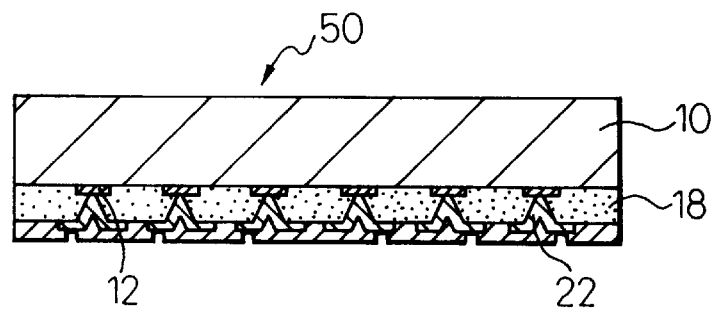
Figure 19C:
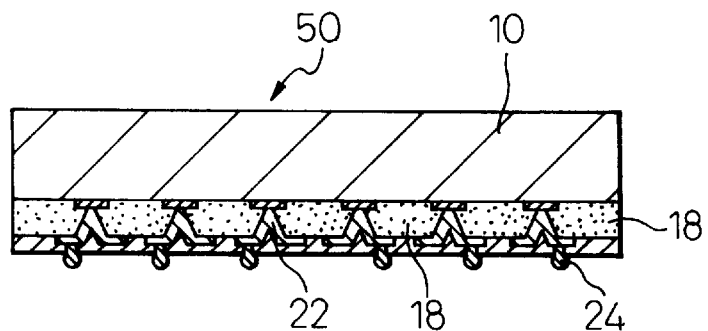

FIGS. 19(a1) to 19(c) are views showing a method by which the semiconductor device 50 is formed by making the circuit substrate 40 adhere to the semiconductor chip 10. The semiconductor chip 10 and the circuit substrate 40 are positioned with each other as shown in FIGS. 19(a1) and 19(a2), and the circuit substrate 40 is made to adhere to the semiconductor chip 10 as shown in FIG. 19(b). Then, the external connection terminals 24 such as solder balls are joined to the lands 28. In this way, the semiconductor device 50 can be made as shown in FIG. 19(c).

In this connection, it is possible to use the semiconductor device 50 while the external connection terminals 24 are not joined. In the case of the circuit substrate 40 provided with the connection terminals 23, it is possible to use it as the semiconductor device 50 as it is. Also, in the case of the circuit substrate 40 provided with the connection terminals 23, solder bumps may be attached to the connection terminals 23.

Figure 20:
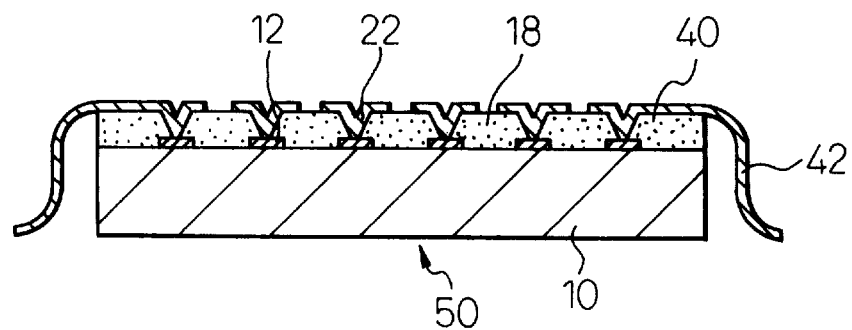
FIG. 20 is a cross-sectional view showing another embodiment of the semiconductor device.

The semiconductor device 50 is not limited to the facedown type shown in FIG. 19, but it is possible to adopt the face-up type shown in FIG. 20. Reference numeral 42 is a lead extending from the periphery of the electrode terminal carrying surface of the semiconductor chip 10. The lead 42 is bent so that it can be connected with the connecting section of the mount substrate.

Figure 21:
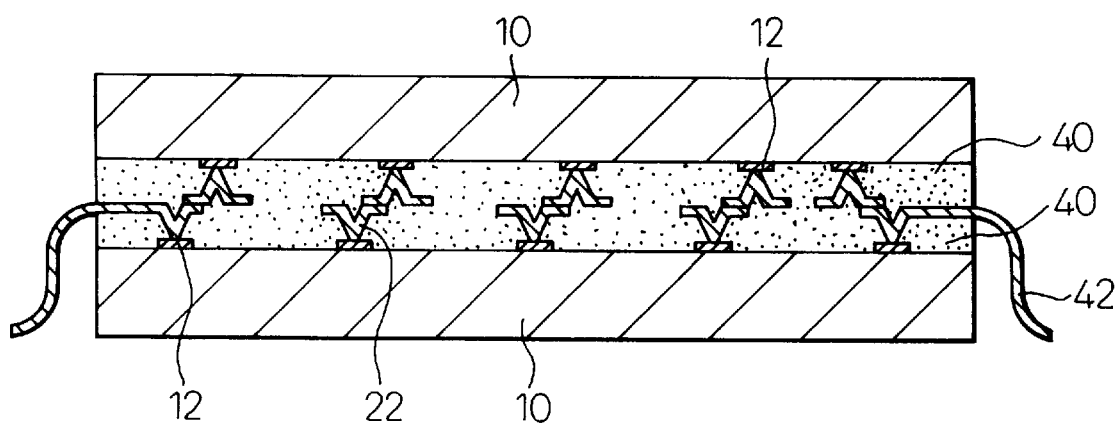
FIG. 21 is a cross-sectional view showing still another embodiment of the semiconductor device.
Figure 22:
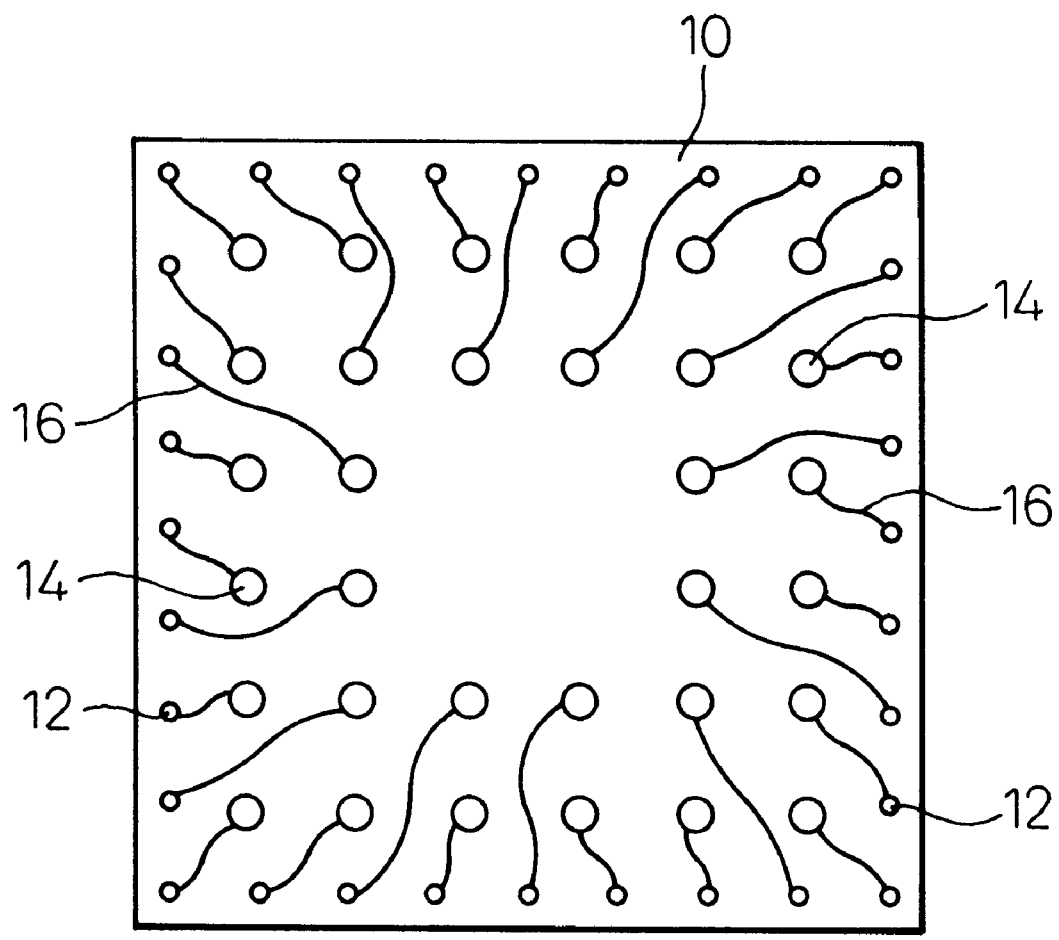
FIG. 22 is a schematic illustration showing an arrangement of the electrode terminals and lands of the semiconductor chip.

FIG. 21 is a view showing a semiconductor device in which two semiconductor chips 10 are laminated on each other by using a multilayer circuit substrate. Electrode terminal carrying surfaces of the semiconductor elements 10, 10 are opposed to each other, and the adhesive agent layers 18 of the multilayer circuit substrate are made to adhere onto the electrode terminal carrying surfaces of the semiconductor chips 10, 10. Due to the foregoing, it is possible to obtain a semiconductor device in which the electrode terminals 12 of the semiconductor chips 10, 10 are electrically connected to the lead 42.

What is claimed is:

1. A circuit substrate composed of multiple layers characterized in that the first layer comprises bumps, which are electrically connected to connection electrodes and a bottom surface of a foil wiring pattern provided on one face of a surface mount device which is a semiconductor chip or a chip size package, wherein said bumps are arranged in the same plane arrangement as that of said connection electrodes and protrude from one side of the sheet of metal foil; and the other layers comprise a plurality of wiring patterns, one in each of the plurality of layers, which comprise bumps and are electrically connected via said bumps to each other or to the wiring pattern in the first layer; and an insulating adhesive agent layer adhering to each of said sheet of metal foil wiring patterns having bumps.

2. A circuit substrate of multiple layers according to claim 1, wherein the wiring pattern is an island-shaped wiring pattern having a land to which an external connection terminal is Joined at a base portion of the bumps.

3. A circuit substrate of a multiple layer according to claim 1, wherein the wiring pattern is a wiring pattern having a land to which the external connection terminal is joined on the other end side of the bump.

4. A circuit substrate of a multiple layer according to claim 1, wherein tips of the bumps are protruded from a single surface of the insulating adhesive agent layer.

5. A semiconductor device characterized in that: a circuit substrate comprised of multiple layers, where a layer is provided in such a manner that bumps, which are electrically connected to connection electrodes provided on one face of a surface mount device which is a semiconductor chip or a chip size package and to metal foil wiring patterns, are arranged in the same arrangement as that of said connection electrodes and protrude onto a first side of the sheet of metal foil;

said wiring patterns, which are electrically connected to said bumps with each other, being formed on said one side of the sheet of metal foil;

external connection terminals are protruded onto a second side of said sheet of metal foil; and an insulating adhesive agent layer is made to adhere onto said one side of the sheet of metal foil, wherein the circuit substrate is made to adhere onto said one face of the surface mount device by said insulating adhesive agent layer; and tips of the bumps respectively come into contact with the connection electrodes and said wiring patterns.

6. A semiconductor device according to claim 5, wherein the wiring pattern is an island-shaped wiring pattern having a land to which the external connection terminal is joined at a base portion of the bump.

7. A semiconductor device according to claim 5, wherein the wiring pattern is a wiring pattern having a land to which the external connection terminal is joined on the other end side of the bump.

8. A semiconductor device according to claim 5, wherein the external connection terminals are joined to the lands.

9. A semiconductor device characterized in that: a circuit substrate of multiple layers which are composed in such a manner that bumps, which are electrically connected to connection electrodes provided on one face of a surface mount device which is a semiconductor chip or chip size package, are arranged in the same plane arrangement as that of said connection electrodes and protruded onto one side of a sheet of metal foil;

said sheet of metal foil on which wiring patterns are formed for electrically connecting said bumps to external connection terminals with each other;

external connection terminals which respectively correspond to the bumps and are protruded onto the other side of the sheet of metal foil; and an insulating adhesive agent layer is made to adhere onto said one face of the sheet of metal foil having bumps, is made to adhere onto said one face of the surface mount device by said insulating adhesive agent layer; and tips of the bumps respectively come into contact with the connection electrodes.

10. A semiconductor device according to claim 9, wherein the outside of the external connection terminals are plated with solder.

11. A semiconductor device according to claim 9, wherein the external connection terminals are made of conductive material different from that of the sheet of metal foil.

12. A semiconductor device according to claim 9, wherein the pointed end portion of the outside of the external connection terminals is formed flat.

13. A circuit substrate composed of a plurality of layers and including:

a first layer comprising
- a first wiring pattern foil with a plurality of bumps, said bumps which are electrically connected to connection electrodes provided on one face of a surface mount device which is a semiconductor chip or chip size package, and which are arranged in the same plane as that of said connection electrodes, wherein the bumps protrude from one side of a sheet of metal foil which form the first wiring pattern and are electrically connected to the first wiring pattern; and
- an insulating adhesive agent layer adapted to adhere onto one face of said metal foil having bumps; and at least one additional layer which comprises
- a second wiring pattern foil with a plurality of bumps, said bumps which are electrically connected to the first wiring pattern, and which are arranged in the same plane as that of said first wiring pattern, wherein the bumps protrude onto one side of the sheet of metal foil which form the second wiring pattern, and are electrically connected to the second wiring pattern; and
- an insulating adhesive agent layer adapted to adhere onto one face of said metal foil having bumps.

14. The circuit substrate of claim 13, wherein the wiring pattern which is not the first wiring pattern is an island-shaped wiring pattern having a land to which an external connection terminal is joined at a base portion of the bumps.

15. The circuit substrate of claim 14, wherein the external connection terminals are made of conductive material different from that of the sheet of metal foil.

16. The circuit substrate of claim 15, wherein the conductive material is made of conductive paste.

17. The circuit substrate of claim 13, wherein a wiring pattern which is not the first wiring pattern is a wiring pattern having a land to which the external connection terminal is joined on the other end side of the bump.

18. The circuit substrate of claim 13, wherein tips of the bumps protrude from a surface of the insulating adhesive agent layer.

19. The circuit substrate of claim 13, further comprising a power supply layer.

20. The circuit substrate of claim 13, further comprising a ground.

21. The circuit substrate of claim 13, further comprising external connection terminals protruding from a second side from said foil wiring patterns.

* * * * *